United States Patent
Nariman et al.

(10) Patent No.: US 6,927,080 B1
(45) Date of Patent: Aug. 9, 2005

(54) STRUCTURES FOR ANALYZING ELECTROMIGRATION, AND METHODS OF USING SAME

(75) Inventors: Homi E. Nariman, Austin, TX (US); James Broc Stirton, Austin, TX (US); Kevin R. Lensing, Austin, TX (US); Steven P. Reeves, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 10/281,760

(22) Filed: Oct. 28, 2002

(51) Int. Cl.[7] .............................................. H01L 21/66
(52) U.S. Cl. ............................ 438/14; 438/29; 438/45
(58) Field of Search ............................... 438/14, 15, 29, 438/45, 46, 53

(56) References Cited

U.S. PATENT DOCUMENTS

| | | | | |
|---|---|---|---|---|
| 5,115,344 A | * | 5/1992 | Jaskie | 359/573 |
| 5,400,063 A | * | 3/1995 | Kappel | 347/58 |
| 6,556,652 B1 | * | 4/2003 | Mazor et al. | 378/86 |
| 2002/0017906 A1 | * | 2/2002 | Ho et al. | 324/526 |
| 2002/0101585 A1 | * | 8/2002 | Benesch et al. | 356/237.4 |

* cited by examiner

*Primary Examiner*—Caridad Everhart
(74) *Attorney, Agent, or Firm*—Williams, Morgan & Amerson, P.C.

(57) ABSTRACT

The present invention is generally directed to various structures for analyzing electromigration, and methods of using same. In one illustrative embodiment, the method includes forming a grating structure above a semiconducting substrate, the grating structure being comprised of a plurality of conductive features, forcing an electrical current through at least one of the conductive features until a resistance of the conductive feature increases by a preselected amount, and performing at least one scatterometric measurement of the conductive feature to determine a critical dimension of the conductive feature. In another illustrative embodiment, the method includes forming a plurality of grating structures above a semiconducting substrate, each of the grating structures being comprised of a plurality of conductive features having the same critical dimension, the critical dimension of the features of each of the plurality of grating structures being different, and forcing an electrical current through at least one of the conductive features in each of the plurality of grating structures until a resistance of the conductive feature increases by a preselected amount.

65 Claims, 4 Drawing Sheets

STRUCTURES FOR ANALYZING ELECTROMIGRATION, AND METHODS OF USING SAME

BACKGROUND OF THE INVENTION

1. Field of the Invention

This invention relates generally to semiconductor fabrication technology, and, more particularly, to structures for analyzing electromigration, and methods of using same.

2. Description of the Related Art

By way of background, modern integrated circuit devices, e.g., microprocessors, ASICs, memory devices, etc., are comprised of millions of field effect transistors formed on a semiconducting substrate, such as silicon. The substrate may be doped with either N-type or P-type dopant materials. An illustrative field effect transistor 10, as shown in FIG. 1, may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g. arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit product is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

As device dimensions have continued to shrink, the packing density of the semiconductor devices, e.g., transistors, has increased. That is, ever increasing numbers of transistors or memory cells are located on the same plot space of a semiconducting substrate. As a result of this increased device density, the conductive metal lines and contacts or vias that connect these various devices have also been reduced in physical size, and they are also packed more closely together. In general, the resistance of a metal line is inversely proportional to the cross-sectional area of the metal line. Thus, all other things being equal, it is important that the cross-sectional area of the metal line be maintained above certain minimum levels such that the resistance of the metal line does not exceed allowable limits. Unanticipated increases in the resistance of a metal line may adversely impact device performance, e.g., a reduction in operating frequency, increased heat build-up, increased power consumption, etc.

Unfortunately, a phenomenon known as electromigration can adversely impact conductive metal lines in an integrated circuit product. In general, electromigration is a process whereby a conductive structure, such as a metal line, contact or via tends to degrade, thereby resulting in a change in the physical characteristics, e.g., shape, size, etc., of the conductive structure. Typically, electromigration occurs when a current is passed through relatively long conductive structures. The current sets up an electrical field in the conductive structure that decreases from the input side to the output side of the conductive structure. Additionally, heat generated by the flowing current sets up a thermal gradient along the conductive structure. As a result, the metal atoms in the conductive structure become mobile and diffuse within the conductive structure. This electromigration phenomenon results in physical changes to the size and/or shape of the conductive structure. For example, in some cases, the conductive structure may be thinned at one or more locations. In a worst case scenario, electromigration can cause complete separation of the conductive structure. This electromigration phenomenon can occur on metals such as aluminum, copper, tungsten, titanium, etc.

In designing integrated circuit products, efforts are taken to reduce, eliminate or account for electromigration of conductive structures in integrated circuit products. Such efforts may include selecting appropriate materials, making conductive structures sufficiently large such that the effects of electromigration does not adversely impact the performance of the integrated circuit product over its useful life.

Typically, one or more tests are performed on an integrated circuit product to determine its ability to withstand electromigration during the product lifetime. FIG. 2 is an illustrative test structure 30 that can be used for such purposes. The test structure 30 is comprised of a conductive metal line 32, a plurality of dummy metal lines 34, and contacts 36 coupled to each end of the conductive metal line 32. The lines 32, 34 have a layer of insulating material 38 positioned therebetween. A relatively high current, much higher than that anticipated in normal usage of the integrated circuit product, is passed through the conductive metal line 32 until such time as the resistance of the conductive metal line 32 increases by a preselected amount, e.g., 10% or 20%. The increase in resistance is due to material loss and/or change in shape of the conductive metal line 32 due to electromigration. The acceptability of the product as to its ability to withstand electromigration depends upon the time it takes for the conductive metal line to exhibit the established standard for increase in resistance. Such testing can be very time-consuming. For example, such an electromigration test may involve subjecting the conductive metal line 32 to the test current for 10–12 hours.

However, in forming the conductive metal line 32, the critical dimension 32A, i.e., width, of the conductive metal line 32 may vary from that anticipated by the design process. For example, the target critical dimension 32A of the conductive metal line 32 may be 180 nm. Due to variations and/or process bias in one or more of the process tools used in creating the metal line 32, e.g., a stepper exposure tool, an etch tool, etc., the actual critical dimension 32A may vary from that of the target value. For example, the manufactured conductive metal line 32 may have a critical dimension 32A that is actually 171 nm or 189 nm as compared to the target value of 180 nm. Thus, after the electromigration test is performed to breakdown, e.g., 20% increase in resistance, the conductive metal line 32 is typically cross-sectioned, and the critical dimension 32A is measured using a scanning electron microscope. Based upon the measured critical dimension, the duration to breakdown for a conductive metal line 32 having the target critical dimension 32A, e.g., 180 nm, is determined by extrapolating the electromigration data for the tested conductive metal line 32 having the measured critical dimension 32A.

Such a process can be very time-consuming in that it requires the cross-section of one or more portions of the wafer. Moreover, the feedback from the electromigration testing may not be available as quickly as would otherwise be desired.

The present invention is directed to various structures and methods that may solve, or at least reduce, some or all of the aforementioned problems.

SUMMARY OF THE INVENTION

The present invention is generally directed to various structures for analyzing electromigration, and methods of using same. In one illustrative embodiment, the method comprises forming a grating structure above a semiconducting substrate, the grating structure being comprised of a plurality of conductive features, forcing an electrical current through at least one of the conductive features until a resistance of the conductive feature increases by a preselected amount, and performing at least one scatterometric measurement of the conductive feature to determine a critical dimension of the conductive feature. In further embodiments, the method comprises determining a susceptibility of another conductive feature to electromigration based upon a comparison of a critical dimension of another conductive feature and the determined critical dimension of the conductive feature through which the electrical current was passed.

In another illustrative embodiment, the method comprises forming a plurality of grating structures above a semiconducting substrate, each of the grating structures being comprised of a plurality of conductive features having the same critical dimension, the critical dimension of the features of each of the plurality of grating structures being different, and forcing an electrical current through at least one of the conductive features in each of the plurality of grating structures until a resistance of the conductive feature increases by a preselected amount.

BRIEF DESCRIPTION OF THE DRAWINGS

The invention may be understood by reference to the following description taken in conjunction with the accompanying drawings, in which like reference numerals identify like elements, and in which.

Figure 1:
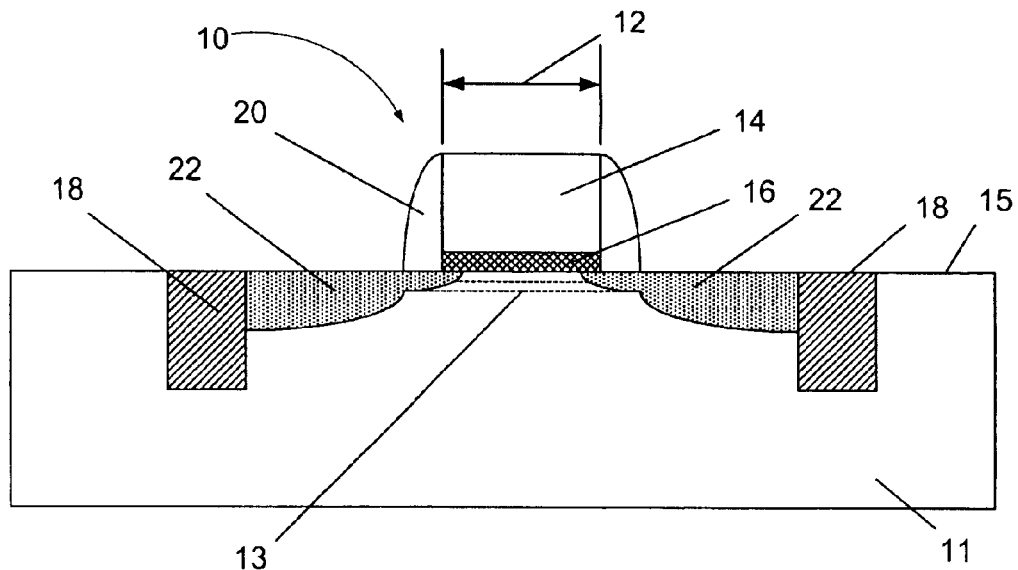
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various structures for analyzing electromigration, and methods of using same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc. Moreover, the present methods may be employed to test the electromigration characteristics of a variety of conductive structures.

In general, the present invention involves performing electromigration tests on one or more grating structures 40 (see FIGS. 3A–3B) and, in some cases, subjecting the grating structures 40 to one or more scatterometric measurement processes. Based upon the results of these measurements, a variety of information may be obtained as to the susceptibility of the grating structures 40 to withstand electromigration.

Figure 3A:
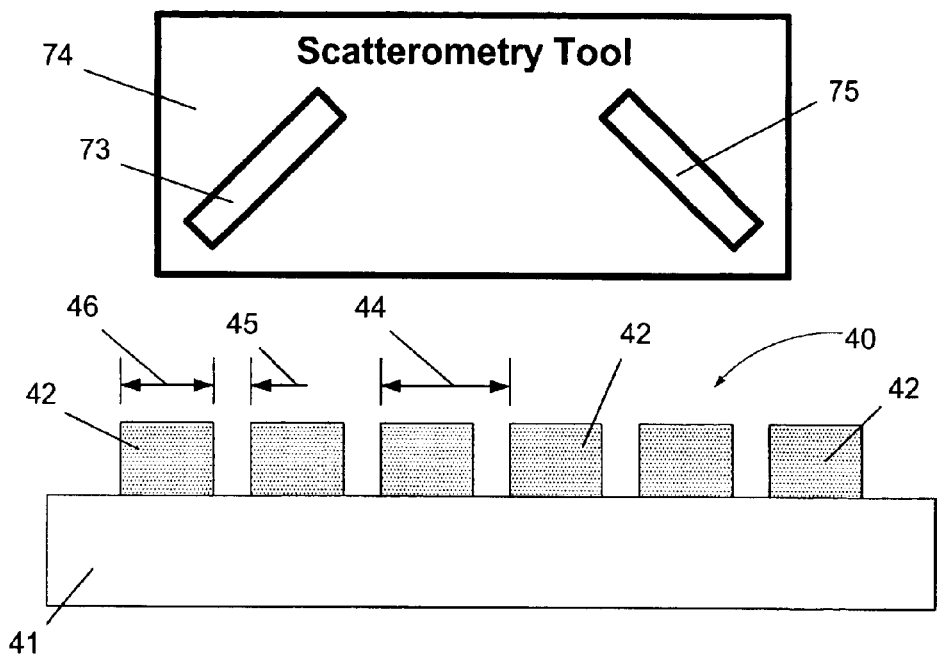
FIGS. 3A–3B depict one illustrative embodiment of a grating structure that may be employed with the present invention.
Figure 3B:
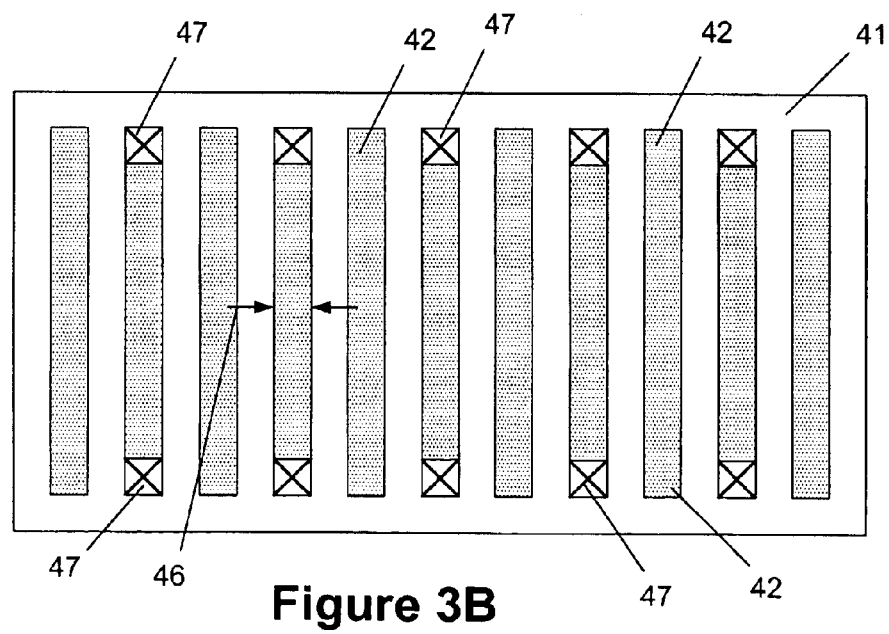

Some aspects of the present invention will now be described with reference to FIGS. 3A–3B. According to one embodiment of the present invention, a grating structure 40 is comprised of a plurality of conductive line-type features 42, e.g., conductive metal lines, etc. The illustrative grating structure 40 depicted in FIGS. 3A–3B is comprised of a plurality of conductive features 42 that are intended to be representative in nature in that they may take any form or shape and they may be comprised of any type of material, e.g., aluminum, copper, titanium, tungsten, etc. The conductive features 42 may also have one or more cap layers, e.g., titanium, titanium nitride, positioned adjacent to the conductive feature 42, although such cap layers are not depicted in the attached drawings. Moreover, an insulating material, such as silicon dioxide, will generally be formed around the conductive features 42 although such an insulating layer is not depicted in the drawings.

The conductive features 42 that comprise the grating structure 40 may be formed at any level of an integrated circuit product. For ease of explanation, the features 42 of the grating structure 40 are depicted as simply being formed above the wafer 41. However, after a complete reading of the present application, those skilled in the art will recognize that the present invention has broad applicability. Thus, the present invention should not be considered as limited to any specific size or configuration of the conductive features 42, the materials comprising the features 42, or to any particular location of one or more of the grating structures 40 above the wafer 41 unless such limitations are expressly set forth in the appended claims.

The grating structure 40 may be of any size or configuration. Typically, the grating structure 40 will be relatively large, e.g., up to, for example, 100 $\mu$m×100 $\mu$m (10,000 $\mu$m$^2$). Of course, the grating structure 40 need not be square or even rectangular in configuration. The number of conductive features 42 that comprise the grating structure 40, as well as the cross-sectional configuration of the features 42 and the pitch 44 and/or spacing 45 therebetween, may also vary. For example, as shown in FIG. 3A, the features 42 have a generally rectangular cross-sectional configuration. The illustrative features 42 may be a plurality of conductive metal lines of an integrated circuit product. The conductive features 42 have a critical dimension 46. FIG. 4B is a plan view of the illustrative grating structure 40. Conductive contacts 47 may be provided at opposite ends of one or more of the conductive features 42. For example, as depicted in FIG. 4B, conductive contacts 47 are provided on each end of every other conductive feature 42. Of course, other contacting schemes may be employed. The non-contacted conductive features 42 may serve as dummy features during subsequent electromigration testing.

The grating structure 40 may be formed as a separate test structure, or in some embodiments, it may be comprised of features 42, e.g., lines, that are part of actual production devices. For example, the grating structure 40 may be essentially a test structure that is formed in an unused area or scribe line of a wafer. In the case of actual production devices, the features 42 that comprise the grating structure 40 may be formed as part of the processes of forming conductive metal lines for an integrated circuit product.

The number of conductive features 42 that comprise the grating structure 40 may also vary. For example, the grating structure 40 may occupy approximately 100 $\mu$m×100 $\mu$m (10,000 $\mu$m$^2$) of surface area, and approximately 100–700 conductive features 42 may be part of the grating structure 40. For ease of explanation, only six representative conductive features 42 are depicted in FIG. 3A. Additional conductive features 42 are depicted in FIG. 3B. As will be recognized by those skilled in the art after a complete reading of the present application, the size, shape and number of conductive features 42 that make up the grating structure 40 should not be considered as a limitation of the present invention unless such limitations are expressly set forth in the appended claims. Additionally, the conductive features 42 may be comprised of a variety of materials or combination of materials. For example, the conductive features 42 may be comprised of aluminum, copper, tungsten, titanium, etc. One or more capping layers, e.g., titanium, titanium nitride, may be positioned adjacent at least portions of the conductive features 42.

In one embodiment of the present invention, the critical dimension 46 of one or more of the conductive features 42 of the grating structure 40 may be measured using scatterometric techniques. An illustrative scatterometry tool 74 that may be used with the present invention is schematically depicted in FIG. 3A. The scatterometry tool 74 is generally comprised of a representative light source 73 and a detector 75, as depicted in FIG. 3A. The scatterometric measurements will be used for purposes described more fully below.

A variety of scatterometry tools 74 may be used with the present invention, e.g., so-called 2θ-type systems and lens-type scatterometry tools. The scatterometry tool 74 may use white light, or some other wavelength or combination of wavelengths, depending on the specific implementation. Typically, the scatterometry tool 74 will generate an incident beam that has a wide spectral composition and wherein the intensity of the light changes slowly in comparison to changes in wavelength. The angle of incidence of the light may also vary, depending on the specific implementation. The optical characteristic traces generated by the scatterometry tool 74 may be based upon a comparison of light intensity to wavelength (for white light, fixed angle type scatterometry tools) or a comparison of intensity to incident angle (for angle resolved systems that use a single light source). The optical characteristic traces may be based upon any aspect of a reflection profile (e.g., intensity vs. wavelength —tan($\delta$), phase vs. wavelength–sin($\psi$), where $\delta$ and $\psi$ are common scatterometry outputs known to those of ordinary skill in the art).

In general, the scatterometry tool 74 includes optical hardware, such as an ellipsometer or reflectometer, and a data processing unit loaded with a scatterometry software application for processing data collected by the optical hardware. For example, the optical hardware may include a Model OP5230 or OP5240 with a spectroscopic ellipsometer offered by Thermawave, Inc. of Fremont, Calif. The data processing unit may comprise a profile application server manufactured by Timbre Technologies, a fully owned subsidiary of Tokyo Electron America, Inc. of Austin, Tex. and distributed by Thermawave, Inc. Scatterometry libraries are commercially available from Timbre Technologies, Inc.

In one aspect of the present invention, electromigration analysis is performed by passing an electrical current through one or more of the conductive features 42 of the grating structure 40. This may be accomplished by coupling the appropriate voltage supply to one of the contacts 47 on the desired conductive feature 42. Scatterometric measurements of the conductive features 42 subjected to the electrical current may be made to determine the critical dimension 46 of the conductive feature 42. In one embodiment, such scatterometric measurements are made after breakdown has occurred, i.e., after the resistance of the conductive feature 42 has increased above a preselected amount, such as 20%. At that time, scatterometric measurements of the tested conductive feature 42 may be made to determine its actual, manufactured critical dimension 46. With this information in hand, electromigration effects on conductive features 42 having smaller or larger critical dimensions 46 may be extrapolated. Of course, if desired, the critical dimension 46 of the conductive feature 42 may be measured prior to forcing electrical current through the conductive feature 42.

Figure 2:
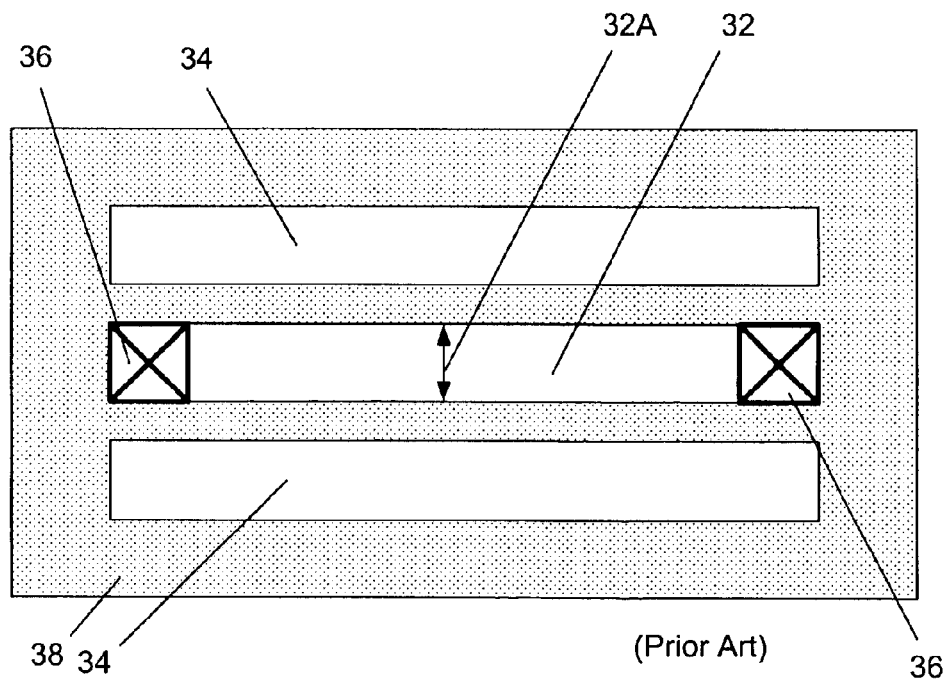
FIG. 2 is a plan view of an illustrative prior art structure employed in electromigration testing.

Through use of scatterometry-based measurement techniques, the critical dimension 46 of the tested conductive feature 42, i.e., the one subjected to the current flow, may be readily determined without resort to destructive testing, i.e., cross-sectioning the grating structure 40 and measuring the critical dimension 42 using other measurement techniques, such as a scanning electron microscope. The methods involved in using scatterometry to measure a critical dimension of a feature of a grating structure are well known to those skilled in the art and, thus, will not be described in any further detail herein. The scatterometric measurement of the critical dimension 46 of the tested conductive feature 42 may be performed at any point during the manufacture of integrated circuit products on the wafer. That is, in employing the present invention, the critical dimension 46 of the tested conductive feature 42 may be performed at any point after the conductive feature 42 is formed. Thus, it is not necessary to wait for all production steps to be completed to determine the critical dimension 46 of the conductive feature 42 as is the case with prior art techniques when cross-sectioning of the conductive line 32 (see FIG. 2) was involved in determining the critical dimension 32A of the tested feature 42. As a result, the present invention can be employed to provide more timely feedback as the ability of the integrated circuit product to withstand electromigration. Such methodologies may result in better control of manufacturing processes and improved yields may be obtained, thereby resulting in improved overall manufacturing efficiencies.

Figure 4A:
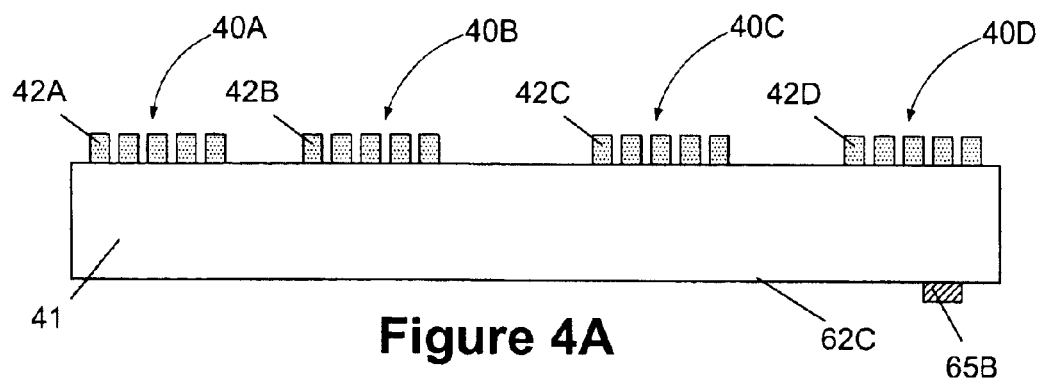
FIGS. 4A–4B depict an embodiment of the present invention wherein a plurality of grating structures may be employed.
Figure 4B:
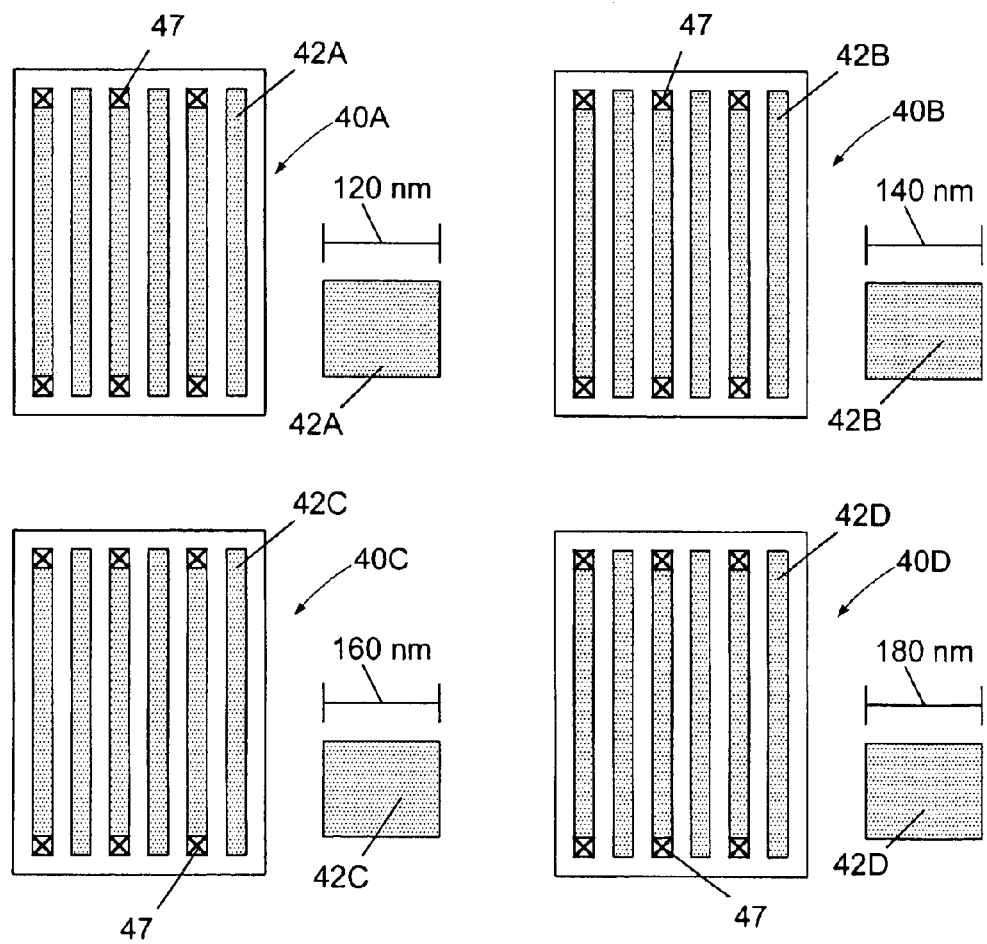

FIGS. 4A–4B depict another aspect of the present invention. As shown therein, a plurality of grating structures 40A–40D are formed above a semiconducting substrate 41. Although four illustrative grating structures 40A–40D are depicted in FIGS. 4A–4B, the present invention may be employed in other situations where more or less than four grating structures 40 are employed. For example, the present invention may be employed in situations where only three grating structures 40 are formed above the substrate 41. The grating structures 40A–40D may be formed at any level of an integrated circuit product. Thus, as will be recognized by those skilled in the art after a complete reading of the present application, the present invention should not be considered as limited to the formation of any particular number of grating structures 40 above the substrate 41 unless such limitations are expressly set forth in the appended claims.

In general, each of the grating structures 40A–40D is comprised of a plurality of conductive features 42A–42D, respectively. The conductive features 42A–42D may be of any size, shape or configuration, and they may be comprised of a variety of materials, e.g., aluminum. According to the present invention, the conductive features 42A–42D have different critical dimensions. That is, for example, the conductive features 42A, 42B, 42C and 42D may have a critical dimension of, respectively, 120 nm, 140 nm, 160 nm and 180 nm, as indicated in FIG. 4B. Stated another way, the grating structures 40A–40D are comprised of different size conductive features 42.

As with the previously described grating structure 40 in FIGS. 3A–3B, conductive contacts 47 may be provided to one or more of the conductive features 42 in each of the grating structures 40A–40D. An electrical current may be passed through one or more of the conductive features 42 on each of the grating structures 40A–40D. This process may be continued until breakdown occurs, i.e., until the resistance of the tested conductive features 42 increases above a preselected amount, e.g., 10–20%. This process occurs for each of the grating structures 40A–40D. Scatterometric measurements of the conductive features 42 for each of the grating structures 40A–40D may be made to determine the actual manufactured critical dimension of each of the measured conductive features 42 on each of the grating structures 40A–40D. Given the different critical dimensions 46 of the features as one progresses from one grating structure to another, the current passed through the conductive features 42 may also vary such that the same current density ($A/cm^2$) is applied to each conductive feature 42.

Figure 5:
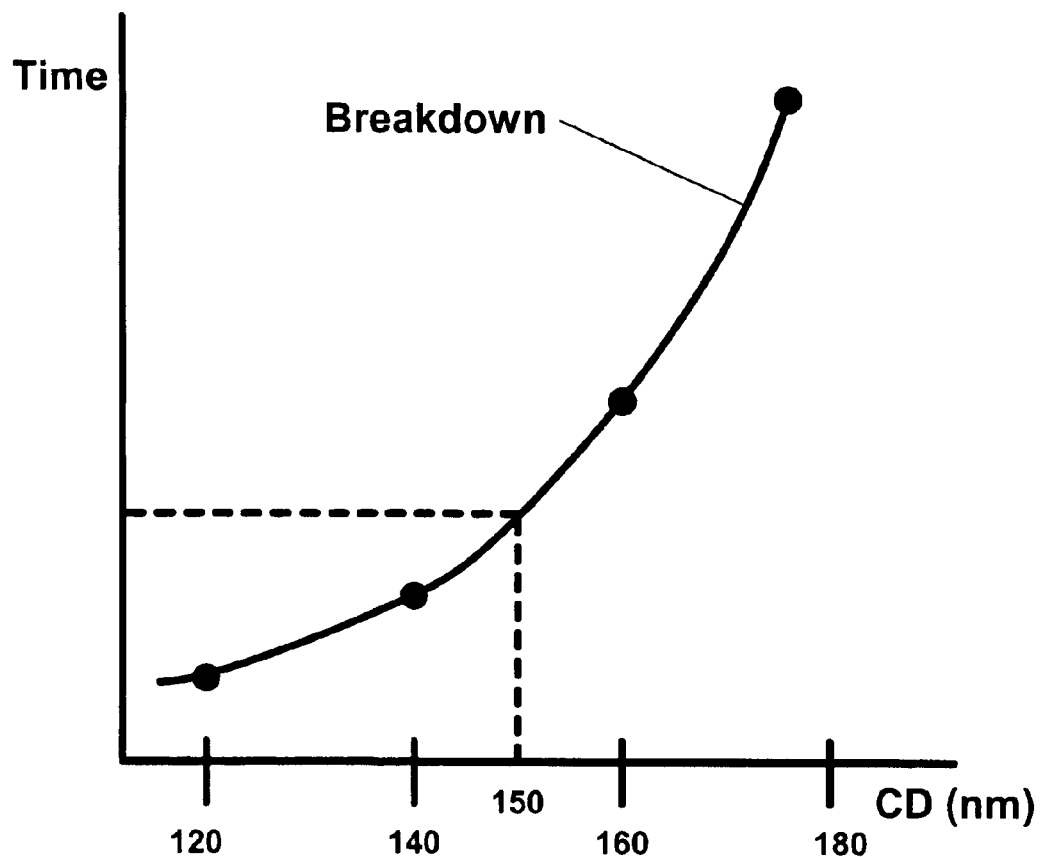
FIG. 5 is an illustrative plot of the duration until electromigration breakdown versus the critical dimensions of measured conductive features.

Based upon this information, a plot may be made of breakdown points for each of the grating structures 40A–40D, each of which have conductive features 42 with different critical dimension. FIG. 5 is an illustrative plot that may be produced from this information. As shown therein, the vertical axis reflects the time taken to reach breakdown. The horizontal axis reflects the measured critical dimension of the tested conductive features 42. The data points on the plot of FIG. 5 represent the plotted time to breakdown for each of the various critical dimension sizes.

With such information, the ability of conductive features 42 of varying critical dimensions to withstand electromigration may be readily determined by interpolating the information from the plot shown in FIG. 5. For example, if a target critical dimension for conductive features that may be subjected to electromigration is selected as 150 nm, then the duration to breakdown may be readily determined by graphical analysis, as indicated by the dashed lines in FIG. 5. By providing these plurality of grating structures 40A–40D with the different size conductive features, the effects of electromigration on production features of varying critical dimension sizes may be more easily and rapidly determined. As a result, manufacturing efficiencies may also increase.

Figure 6:
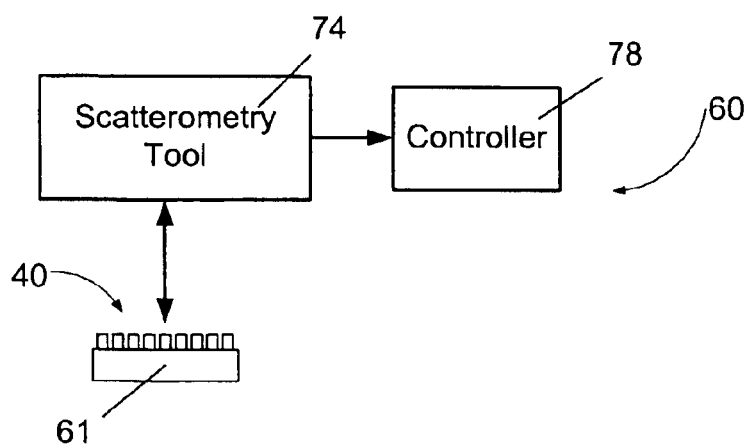
FIG. 6 is a schematic depiction of an illustrative system that may be employed with the present invention.

An illustrative system 60 that may be used in one embodiment of the present invention is shown in FIG. 6. The system 60 is comprised of a scatterometry tool 74 and a controller 78. As indicated in FIG. 6, the wafer 61 is representative of one or more wafers having one or more grating structures 40, formed thereabove. The scatterometric measurements described herein may be made solely within the scatterometry tool 74 or in combination with the processing resources provided by the controller 78.

In the illustrated embodiments, the controller 78 is a computer programmed with software to implement the functions described herein. Moreover, the functions described for the controller 78 may be performed by one or more controllers spread through the system. For example, the controller 78 may be a fab level controller that is used to control processing operations throughout all or a portion of a semiconductor manufacturing facility. Alternatively, the controller 78 may be a lower level computer that controls only portions or cells of the manufacturing facility. Moreover, the controller 78 may be a stand-alone device, or it may reside on the scatterometry tool 74. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 78, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI.

In one aspect, the present invention is generally directed to various structures for analyzing electromigration, and methods of using same. In one illustrative embodiment, the method comprises forming a grating structure above a semiconducting substrate, the grating structure being comprised of a plurality of conductive features, forcing an electrical current through at least one of the conductive features until a resistance of the conductive feature increases by a preselected amount, and performing at least one scatterometric measurement of the conductive feature to determine a critical dimension of the conductive feature. In further embodiments, the method comprises determining a susceptibility of another conductive feature to electromigration based upon a comparison of a critical dimension of another conductive feature and the determined critical dimension of the conductive feature through which the electrical current was passed.

In another illustrative embodiment, the method comprises forming a plurality of grating structures above a semiconducting substrate, each of the grating structures being comprised of a plurality of conductive features having the same critical dimension, the critical dimension of the features of each of the plurality of grating structures being different, and forcing an electrical current through at least one of the conductive features in each of the plurality of grating structures until a resistance of the conductive feature increases by a preselected amount.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of performing electromigration analysis, comprising:

forming a grating structure above a semiconducting substrate, said grating structure being comprised of a plurality of conductive features;

forcing an electrical current through at least one of said conductive features until a resistance of said at least one conductive feature increases by a preselected amount; and performing at least one scatterometric measurement of said at least one conductive feature to determine a critical dimension of said at least one conductive feature.

2. The method of claim 1, wherein said conductive features are conductive metal lines.

3. The method of claim 1, wherein said conductive features are comprised of at least one of aluminum, copper, tungsten and titanium.

4. The method of claim 1, wherein said grating structure occupies approximately 10,000 $\mu m^2$ of surface area.

5. The method of claim 1, wherein said grating structure is comprised of approximately 100–700 conductive features.

6. The method of claim 1, wherein performing at least one scatterometric measurement comprises illuminating said at least one conductive feature and measuring light reflected therefrom.

7. The method of claim 1, wherein said at least one scatterometric measurement is performed while said electrical current is being forced through said at least one conductive feature.

8. The method of claim 1, wherein said at least one scatterometric measurement is performed after stopping said electrical current.

9. The method of claim 1, wherein said at least one scatterometric measurement is performed before said current is forced through said conductive feature.

10. The method of claim 1, wherein said at least one scatterometric measurement is performed after said resistance of said conductive feature has increased above said preselected amount.

11. The method of claim 1, wherein said preselected amount is 10–20%.

12. The method of claim 1, further comprising determining a susceptibility of another conductive feature to electromigration based upon a comparison of a critical dimension of said another conductive feature and said determined critical dimension of said conductive feature through which said electrical current was passed.

13. The method of claim 1, further comprising identifying a duration of time that said electrical current was forced through said at least one conductive feature.

14. The method of claim 13, further comprising determining a susceptibility of another conductive feature having a critical dimension different than that of said determined critical dimension based upon a comparison of said different critical dimensions and said identified duration of time.

15. A method of performing electromigration analysis, comprising:

forming a grating structure above a semiconducting substrate, said grating structure being comprised of a plurality of conductive features, said conductive features being comprised of at least one of aluminum, copper, tungsten and titanium;

forcing an electrical current through at least one of said conductive features until a resistance of said at least one conductive feature increases by a preselected amount;

performing at least one scatterometric measurement of said at least one conductive feature to determine a critical dimension of said at least one conductive feature; and identifying a duration of time that said electrical current was forced through said at least one conductive feature.

16. The method of claim 15, wherein said conductive features are metal lines.

17. The method of claim 15, wherein said grating structure occupies approximately 10,000 $\mu m^2$ of surface area.

18. The method of claim 15, wherein said grating structure is comprised of approximately 100–700 conductive features.

19. The method of claim 15, wherein performing at least one scatterometric measurement comprises illuminating said at least one conductive feature and measuring light reflected therefrom.

20. The method of claim 15, wherein said at least one scatterometric measurement is performed while said electrical current is being forced through said at least one conductive feature.

21. The method of claim 15, wherein said at least one scatterometric measurement is performed after stopping said electrical current.

22. The method of claim 15, wherein said at least one scatterometric measurement is performed before said current is forced through said conductive feature.

23. The method of claim 15, wherein said at least one scatterometric measurement is performed after said resistance of said conductive feature has increased above said preselected amount.

24. The method of claim 15, wherein said preselected amount is 10–20%.

25. The method of claim 15, further comprising determining a susceptibility of another conductive feature to electromigration based upon a comparison of a critical dimension of said another conductive feature and said determined critical dimension of said conductive feature through which said electrical current was passed.

26. The method of claim 15, further comprising determining a susceptibility of another conductive feature having a critical dimension different than that of said determined critical dimension based upon a comparison of said different critical dimensions and said identified duration of time.

27. A method of performing electromigration analysis, comprising:

forming a grating structure above a semiconducting substrate, said grating structure being comprised of a plurality of conductive features comprised of aluminum;

forcing an electrical current through at least one of said conductive features until a resistance of said at least one conductive feature increases by a preselected amount that ranges from 10–20%;

performing at least one scatterometric measurement of said at least one conductive feature to determine a critical dimension of said at least one conductive feature;

identifying a duration of time that said electrical current was forced through said at least one conductive feature; and determining a susceptibility of another conductive feature having a critical dimension different than that of said determined critical dimension based upon a comparison of said different critical dimensions and said identified duration of time.

28. The method of claim 27, wherein said grating structure occupies approximately 10,000 $\mu m^2$ of surface area.

29. The method of claim 27, wherein said grating structure is comprised of approximately 100–700 conductive features.

30. The method of claim 27, wherein performing at least one scatterometric measurement comprises illuminating said at least one conductive feature and measuring light reflected therefrom.

31. The method of claim 27, wherein said at least one scatterometric measurement is performed while said electrical current is being forced through said at least one conductive feature.

32. The method of claim 27, wherein said at least one scatterometric measurement is performed after stopping said electrical current.

33. The method of claim 27, wherein said at least one scatterometric measurement is performed before said current is forced through said conductive feature.

34. The method of claim 27, wherein said at least one scatterometric measurement is performed after said resistance of said conductive feature has increased above said preselected amount.

35. A method, comprising:

forming a plurality of grating structures above a semiconducting substrate, each of said grating structures being comprised of a plurality of conductive features having the same critical dimension, the critical dimension of said features of each of said plurality of grating structures being different;

forcing an electrical current through at least one of said conductive features in each of said plurality of grating structures until a resistance of said at least one conductive feature in each of said grating structures increases by a preselected amount; and for each of said plurality of grating structures, identifying a duration of time that said current is passed through said at least one conductive feature until said resistance of said at least one conductive feature is increased by said preselected amount.

36. The method of claim 35, further comprising creating a plot of duration until said resistance reaches said preselected amount versus a critical dimension of said conductive features in said plurality of grating structures.

37. The method of claim 35, wherein forming a plurality of grating structures comprises forming at least three grating structures.

38. The method of claim 35, wherein forming a plurality of grating structures comprises forming at least four grating structures.

39. The method of claim 35, wherein said conductive features are conductive metal lines.

40. The method of claim 35, wherein said conductive features are comprised of at least one of aluminum, copper, tungsten and titanium.

41. The method of claim 35, further comprising performing at least one scatterometric measurement on each of said plurality of grating structures to determine a critical dimension of at least one of said conductive features within each of said plurality of grating structures.

42. The method of claim 41, wherein said at least one scatterometric measurement is performed before said current is forced through said conductive feature.

43. The method of claim 41, wherein said at least one scatterometric measurement is performed after said resistance of said conductive feature has increased above said preselected amount.

44. The method of claim 35, wherein said electrical current is forced through said at least one conductive feature until said resistance of said at least one conductive feature increased by 10–20%.

45. A method, comprising:
forming at least three grating structures above a semiconducting substrate, each of said grating structures being comprised of a plurality of conductive features having the same critical dimension, the critical dimension of said features of each of said plurality of grating structures being different, said conductive features being comprised of at least one of aluminum, copper, tungsten and titanium;
forcing an electrical current through at least one of said conductive features in each of said at least three grating structures until a resistance of said at least one conductive feature in each of said at least three grating structures increases by a preselected amount; and
performing at least one scatterometric measurement on each of said plurality of grating structures to determine a critical dimension of at least one of said conductive features within each of said plurality of grating structures.

46. The method of claim 45, further comprising, for each of said plurality of grating structures, identifying a duration of time that said current is passed through said at least one conductive feature until said resistance of said at least one conductive feature is increased by said preselected amount.

47. The method of claim 45, further comprising creating a plot of duration until said resistance reaches said preselected amount versus a critical dimension of said conductive features in said plurality of grating structures.

48. The method of claim 45, wherein said conductive features are conductive metal lines.

49. The method of claim 45, wherein said at least one scatterometric measurement is performed before said current is forced through said conductive feature.

50. The method of claim 45, wherein said at least one scatterometric measurement is performed after said resistance of said conductive features has increased above said preselected amount.

51. The method of claim 45, wherein said electrical current is forced through said at least one conductive feature until said resistance of said at least one conductive feature increased by 10–20%.

52. The method of claim 45, further comprising determining a susceptibility of another conductive feature to electromigration based upon a comparison of a critical dimension of said another conductive feature and said determined critical dimension of said conductive feature in said grating structure through which said electrical current was passed.

53. The method of claim 45, further comprising identifying a duration of time that said electrical current was forced through said at least one conductive feature.

54. The method of claim 53, further comprising determining a susceptibility of another conductive feature having a critical dimension different than that of said determined critical dimension based upon a comparison of said different critical dimensions and said identified duration of time.

55. A method, comprising:
forming at least three grating structures above a semiconducting substrate, each of said grating structures being comprised of a plurality of conductive features having the same critical dimension, the critical dimension of said features of each of said plurality of grating structures being different, said conductive features being comprised of at least one of aluminum, copper, tungsten and titanium;
forcing an electrical current through at least one of said conductive features in each of said at least three grating structures until a resistance of said at least one conductive feature in each of said at least three grating structures increases by a preselected amount; and
for each of said plurality of grating structures, identifying a duration of time that said current is passed through said at least one conductive feature until said resistance of said at least one conductive feature is increased by said preselected amount.

56. The method of claim 55, further comprising creating a plot of duration until said resistance reaches said preselected amount versus a critical dimension of said conductive features in said plurality of grating structures.

57. The method of claim 55, further comprising performing at least one scatterometric measurement on each of said plurality of grating structures to determine a critical dimension of at least one of said conductive features within each of said plurality of grating structures.

58. The method of claim 55, wherein said electrical current is forced through said at least one conductive feature until said resistance of said at least one conductive feature increased by 10–20%.

59. A method, comprising:
forming at least three grating structures above a semiconducting substrate, each of said grating structures being comprised of a plurality of conductive features having the same critical dimension, the critical dimension of said features of each of said plurality of grating structures being different, said conductive features being comprised of at least one of aluminum, copper, tungsten and titanium;
forcing an electrical current through at least one of said conductive features in each of said at least three grating structures until a resistance of said at least one conductive feature in each of said at least three grating structures increases by a preselected amount; and
creating a plot of duration until said resistance reaches said preselected amount versus a critical dimension of said conductive features in said plurality of grating structures.

60. The method of claim 59, further comprising performing at least one scatterometric measurement on each of said plurality of grating structures to determine a critical dimension of at least one of said conductive features within each of said plurality of grating structures.

61. The method of claim 59, wherein said electrical current is forced through said at least one conductive feature until said resistance of said at least one conductive feature increased by 10–20%.

62. A method, comprising:
forming a plurality of grating structures above a semiconducting substrate, each of said grating structures being comprised of a plurality of conductive features having the same critical dimension, the critical dimension of said features of each of said plurality of grating structures being different;
forcing an electrical current through at least one of said conductive features in each of said plurality of grating structures until a resistance of said at least one conductive feature in each of said grating structures increases by a preselected amount;
creating a plot of duration until said resistance reaches said preselected amount versus a critical dimension of said conductive features in said plurality of grating structures; and
performing at least one scatterometric measurement on each of said plurality of grating structures to determine a critical dimension of at least one of said conductive features within each of said plurality of grating structures.

63. The method of claim 62, wherein forming a plurality of grating structures comprises forming at least three grating structures.

64. The method of claim 62, wherein said at least one scatterometric measurement is performed before said current is forced through said conductive feature.

65. The method of claim 62, wherein said at least one scatterometric measurement is performed after said resistance of said conductive feature has increased above said preselected amount.

* * * * *